United States Patent
Meredith et al.

(10) Patent No.: US 9,788,462 B2
(45) Date of Patent: Oct. 10, 2017

(54) DATA CENTER COOLING SYSTEM

(71) Applicants: AT&T INTELLECTUAL PROPERTY I, L.P., Atlanta, GA (US); AT&T Mobility II LLC, Atlanta, GA (US)

(72) Inventors: Sheldon K. Meredith, Roswell, GA (US); William Cottrill, Canton, GA (US); Brandon B. Hilliard, Woodstock, GA (US)

(73) Assignees: AT&T MOBILITY II LLC, Atlanta, GA (US); AT&T INTELLECTUAL PROPERTY I, L.P., Atlanta, GA (US)

(*) Notice: Subject to any disclaimer, the term of this patent is extended or adjusted under 35 U.S.C. 154(b) by 133 days.

(21) Appl. No.: 14/955,566

(22) Filed: Dec. 1, 2015

(65) Prior Publication Data
US 2017/0156239 A1 Jun. 1, 2017

(51) Int. Cl.
*H05K 7/00* (2006.01)
*H05K 7/20* (2006.01)

(52) U.S. Cl.
CPC .............................. *H05K 7/20718* (2013.01)

(58) Field of Classification Search
None
See application file for complete search history.

(56) References Cited

U.S. PATENT DOCUMENTS

| | | |
|---|---|---|
| 5,267,449 A | 12/1993 | Kiczek et al. |
| 5,568,731 A | 10/1996 | Reali |
| 5,586,440 A | 12/1996 | Vincent |
| 6,401,463 B1 | 6/2002 | Dukhan et al. |
| 6,581,394 B1 | 6/2003 | Smolenskiy |
| 6,990,817 B1 | 1/2006 | Bhatia |
| 7,010,930 B2 | 3/2006 | Arik et al. |
| 7,565,808 B2 | 7/2009 | Sullivan |
| 7,751,188 B1 | 7/2010 | French et al. |
| 8,116,913 B2 | 2/2012 | Mirpourian et al. |
| 8,716,981 B2 | 5/2014 | Arseneault et al. |
| 8,726,681 B2 | 5/2014 | Williams |
| 8,937,482 B1 | 1/2015 | Lemczyk |
| 2004/0221603 A1* | 11/2004 | Arik .................. F04D 25/06 62/259.2 |

(Continued)

*Primary Examiner* — Dimary Lopez Cruz
*Assistant Examiner* — Zhengfu Feng
(74) *Attorney, Agent, or Firm* — Akerman LLP; Michael K. Dixon; Mammen (Roy) P. Zachariah, Jr.

(57) ABSTRACT

A data center cooling system configured to cool one or more components of a data center thereby enabling a data center to be maintained at a higher overall temperature while still providing sufficient cooling to the components housed in the data center is disclosed. By maintaining the data center at a higher overall temperature, significant operational costs are realized due to savings in power costs. The data center cooling system may include one or more turbo-expanders having a rotary turbine positioned within a turbo-expander housing in which compressed air expands and drives the rotary turbine. The cooled expanded air is heated passing through a thermal transfer system that pulls heat from the data center component. The air is further heated passing through a brake system that generates heat by applying resistance to a shaft coupled to the rotary turbine. The heated air is exhausted outside of the data center.

21 Claims, 2 Drawing Sheets

(56) References Cited

U.S. PATENT DOCUMENTS

| | | |
|---|---|---|
| 2007/0261415 A1 | 11/2007 | Barnes |
| 2010/0024445 A1 | 2/2010 | Cichanowicz |
| 2011/0146315 A1 | 6/2011 | Zakrzewski |
| 2015/0007596 A1 | 1/2015 | Bean et al. |
| 2016/0222820 A1* | 8/2016 | Truesdale ............... F03B 15/00 |

* cited by examiner

DATA CENTER COOLING SYSTEM

FIELD OF THE DISCLOSURE

The present disclosure generally relates to data centers, and more particularly relates to data center cooling systems.

BACKGROUND

Conventional data centers generate large amounts of heat. Traditionally, data centers have maintained internal air temperatures via heating, ventilation and air conditioning systems (HVAC) much colder than other internal HVAC controlled rooms. Such low temperatures in data centers have been the usual practice because certain equipment in data centers generate a large amount of heat. To date, equipment has been kept sufficiently cool to prevent damage by ensuring that the air at the intakes of the equipment cooling fans positioned within each piece of equipment is sufficiently cold. The air at the intakes of their cooling fans is the ambient air in the data center room. Thus, the air in the room is usually quite cold.

The cost of cooling a data center may be analyzed by reviewing two components. first, a cost exists for removing heat generated by the equipment, and a cost exists for maintaining a temperature difference between air outside of a data center and air inside of a data center. Even in the absence of the first cost, maintaining an inside temperature of 65 degrees Fahrenheit is quite expensive in hot and humid locales, such as Malaysia where the outside temperature may be 100 degrees Fahrenheit with high humidity. Humans working in the facility could work at 78-80 degrees but such an operating range of temperatures places component devices in the data center at risk of damage due to overheating. Thus, a need exists for a more efficient means of operating a data center.

SUMMARY

A data center cooling system configured to cool one or more components of a data center thereby enabling a data center to be maintained at a higher overall temperature while still providing sufficient cooling to the components housed in the data center is disclosed. By maintaining the data center at a higher overall temperature, significant operational costs are realized due to savings in power costs. The data center cooling system may include one or more turbo-expanders having a rotary turbine positioned within a turbo-expander housing in which compressed air expands and drives the rotary turbine. The cooled expanded air passes through a thermal transfer system that pulls heat from a data center component to be cooled and transfers the heat to the air. The air then passes through a brake system where the air picks up more heat. The brake system generates heat by applying a resistive force to a shaft coupled to the rotary turbine. The heated air flows from the brake system to an exhaust system where the heated air is exhausted outside of the data center.

A data center cooling system may include at least one turbo-expander formed from a turbo-expander housing and a rotary turbine coupled to a shaft and positioned within an expansion chamber in the turbo-expander housing. The turbo-expander may include an inlet in fluid communication with the expansion chamber and a brake system coupled to the shaft and offset from the rotary turbine and the expansion chamber. The rotary turbine and the brake system may be separated from each other via at least one thermal transfer system.

A data center may be formed from a room containing at least one electrical component to be cooled. The data center may also include one or more data center cooling systems formed form a turbo-expander housing and a rotary turbine coupled to a shaft and positioned within an expansion chamber in the turbo-expander housing. The turbo-expander may include an inlet in fluid communication with the expansion chamber and at least one exhaust system extending from the turbo-expander housing and configured to exhaust outside of the data center. The turbo-expander may also include a brake system coupled to the shaft and offset from the rotary turbine and the expansion chamber. The rotary turbine and the brake system may be separated from each other via at least one thermal transfer system. The thermal transfer system may be configured to cool the at least one electrical component to be cooled. The data center may also include one or more compressors for compressing air to supply compressed air to the rotary turbine of the turbo-expander.

An advantage of the data center cooling system is that use of the data center cooling system with one or more components that generate heat within a data center may enable the entire ambient temperature of the data center via a HVAC system to be increased by about five to fifteen degrees warmer than conventional systems because individualized cooling is provided with the data center cooling system, which results in tremendous energy costs savings. Such system yields direct savings in terms of HVAC capital infrastructure and monthly electric bills. Data centers in hot and humid climates can have very high costs of cooling. The ability to raise the overall temperature of a data facility by up to 15 degrees would create a major impact on operation costs of a data center.

These and other embodiments are described in more detail below.

BRIEF DESCRIPTION OF THE DRAWINGS

The accompanying drawings, which are incorporated in and form a part of the specification, illustrate embodiments of the presently disclosed invention and, together with the description, disclose the principles of the invention. For simplicity and clarity of illustration, elements illustrated in the Figures have not necessarily been drawn to scale. For example, the dimensions of some of the elements are exaggerated relative to other elements.

DETAILED DESCRIPTION OF THE DRAWINGS

Figure 1:
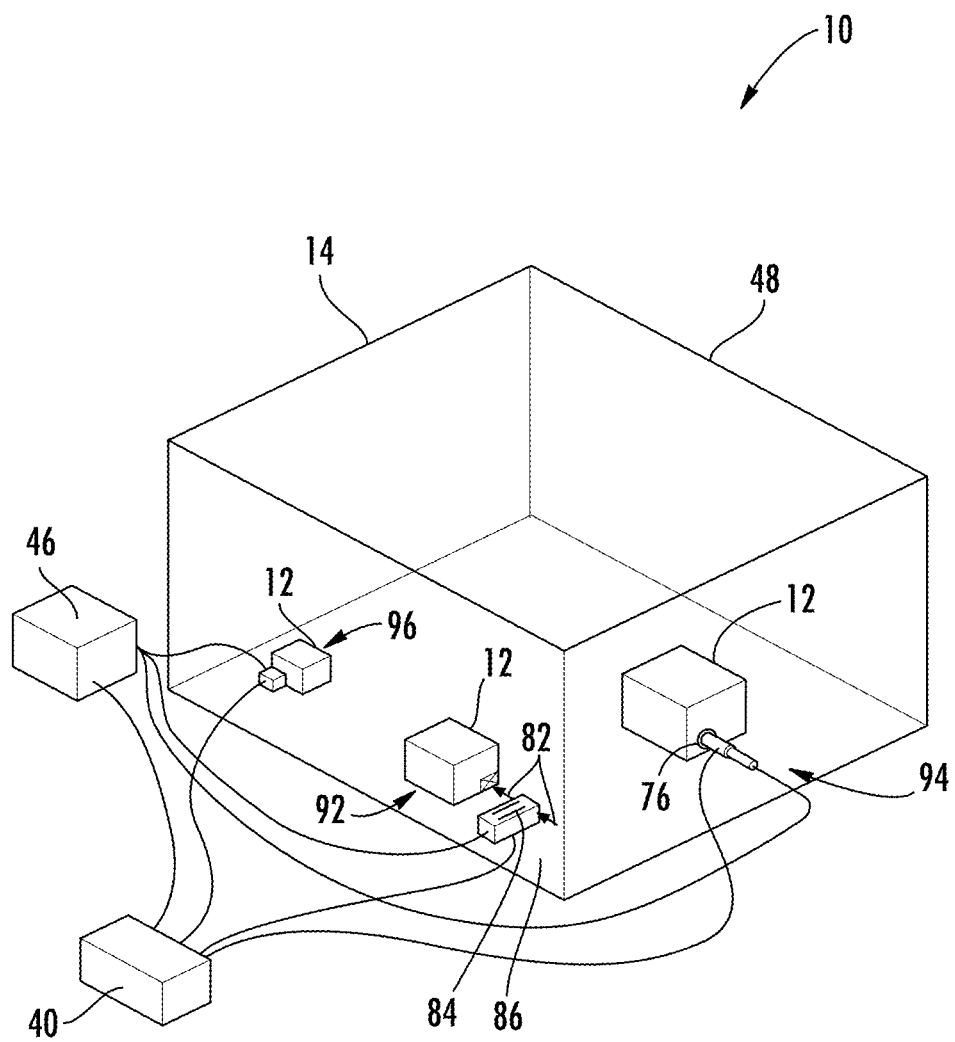
FIG. 1 is a schematic diagram of a data center cooling system configured to cool one or more components of the data center via one or more turbo-expanders thereby enabling the data center to be maintained at a higher overall temperature while still providing sufficient cooling to the components housed in the data center.
Figure 2:
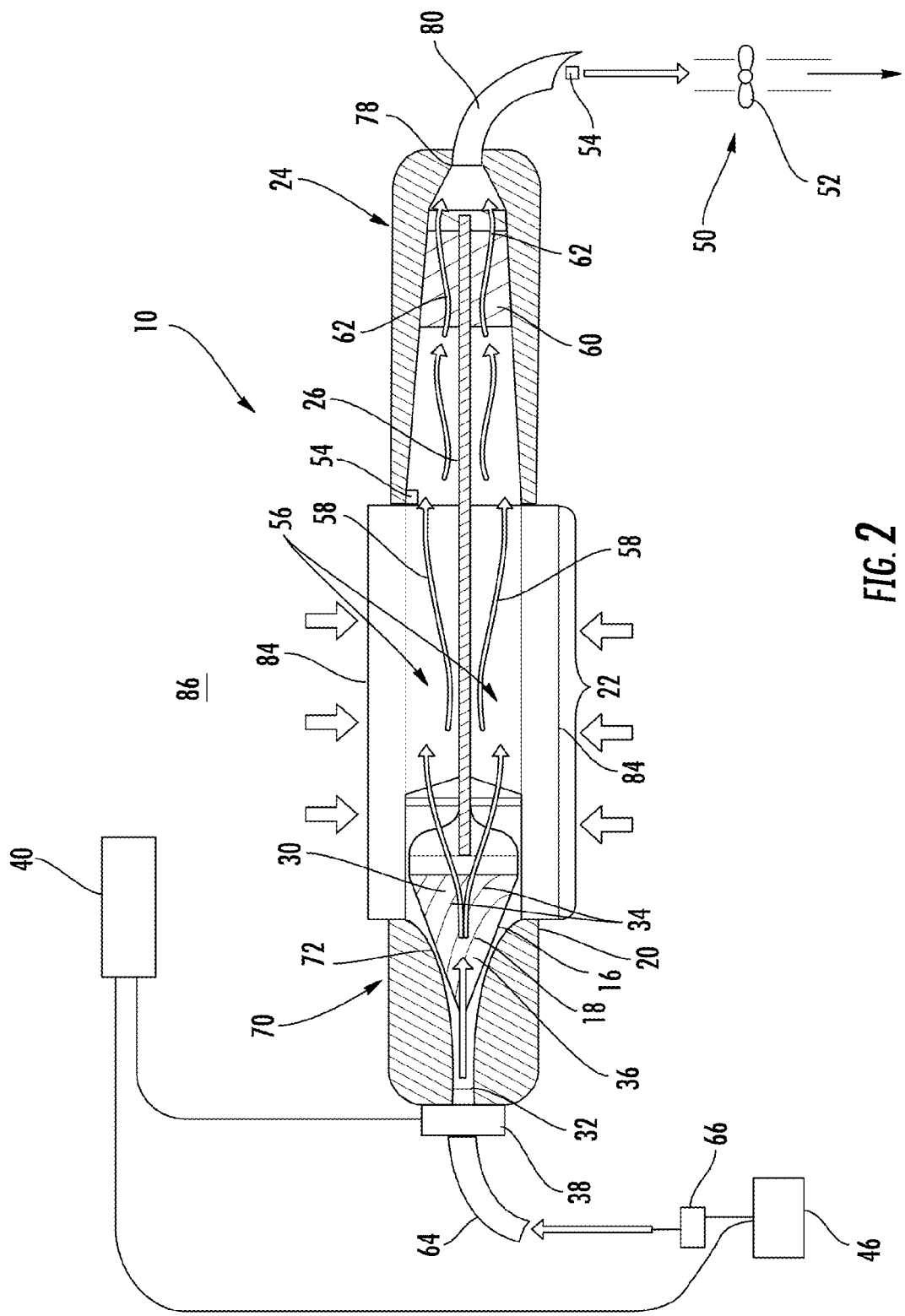
FIG. 2 is a cross-sectional side view of a turbo-expander of the data center cooling system.

As shown in FIGS. 1-2, a data center cooling system 10 configured to cool one or more components 12 of a data center 14 thereby enabling the data center 14 to be maintained at a higher overall temperature while still providing sufficient cooling to the components 12 housed in the data center 14 is disclosed. By maintaining the data center 14 at a higher overall temperature, significant operational costs are realized due to savings in power costs. The data center cooling system 10 may include one or more turbo-expanders 16 having a rotary turbine 18 positioned within a turbo-expander housing 20 in which compressed air expands and drives the rotary turbine 18. The cooled expanded air passes through a thermal transfer system 22 that pulls heat from a data center component to be cooled 12 and transfers the heat to the air. The air then passes through a brake system 24 where the air picks up more heat. The brake system 24 generates heat by applying a resistive force to a shaft 26 coupled to the rotary turbine 18. The heated air flows from the brake system 24 to an exhaust system 28 where the heated air is exhausted outside of the data center 14.

In at least one embodiment, the data center cooling system 10 may be formed from one or more turbo-expanders 16, as shown in FIG. 2, formed from one or more turbo-expander housings 20 and a rotary turbine 18 coupled to a shaft 26 and positioned within an expansion chamber 30 in the turbo-expander housing 20. The turbo-expanders 16 may also include one or more inlets 32 in fluid communication with the expansion chamber 30 and a brake system 24 coupled to the shaft 26 and offset from the rotary turbine 18 and the expansion chamber 30. The rotary turbine 18 and the brake system 24 may be separated from each other via at least one thermal transfer system 22.

The turbo-expander 16 may have any appropriate configuration. In at least one embodiment, the rotary turbine 18 may be formed from a plurality of laminar flow vanes 34. The rotary turbine may be positioned with an expansion chamber 30 having any appropriate shape and configuration. In at least one embodiment, the expansion chamber 30 may have an internal chamber 36 with an increasing cross-sectional area of the opening moving downstream from an inlet 32. The size and shape of the vanes 34 forming the rotary turbine 18 may correspond to the size and shape of the internal chamber 36 of the expansion chamber 30 to increase the effectiveness of the turbo expander 16.

The data center cooling system 10, as shown in FIG. 1, may include one or more adjustable inlet valves 38 in fluid communication with the inlet 32. The adjustable inlet valve 38 may have any appropriate configuration for controlling flow of fluid, such as, but not limited to, air into the expansion chamber 30. The adjustable inlet valve 38 may set manually or automatically via one or more solenoids or the like.

In at least one embodiment, the data center cooling system 10, as shown in FIG. 1, may include a control system 40 having an adjustable inlet valve control module 42 configured to control the adjustable inlet valve 38 based upon operating temperatures of a data center component 12 in communication with the data center cooling system 10. In at least one embodiment, the control system 40 may be configured to function as a feedback control system 40 to control the data center cooling system 10 to control the cooling in order to maintain a target temperature for the data center equipment. During periods of low usage and heat generation, it is possible that very few machines in a data center 14 would need cooling and thus, very few machines would be using the pressurized air. As such, the compressor 46 of the data center cooling system 10, which is positioned outside of the data center 14, and in at least one embodiment, outside of a building 48 housing the data center 14, would cease compressing air and thus, no energy would be expended. Once computing activity increases, the control system 40 may monitor the temperature of the components 12 within the data center 14. Whenever a temperature of a component 12 passes a threshold temperature, the control system 40 may open an adjustable inlet valve 38 supplying compressed air to that component 12. The compressed air flows into the turbo-expander 16 in communication with that component 12, and hot air is exhausted via the exhaust system 28.

In at least one embodiment, the data center cooling system 10, as shown in FIG. 1, may include one or more exhaust systems 28 extending from the turbo-expander housing 20 and configured to exhaust outside of a data center 14. The exhaust system 28 may be formed from any appropriate components necessary to exhaust expanded fluid, such as, but not limited to, expanded air, from the turbo-expander housing 20 and the data center 14. The exhaust system 28 may be formed from any appropriate components, such as, but not limited to, one or more channels, conduits, chambers, pipes, plenums and the like.

The data center cooling system 10 may also include one or more exhaust evacuation systems 50, as shown in FIG. 1, configured to reduce pressure within the exhaust system 28. The data center cooling system 10 may include one or more exhaust fans 52 in communication with the turbo-expander housing 20 to reduce pressure within the turbo-expander housing 20 downstream of the rotary turbine 18. The exhaust fan 52 may have any appropriate configuration, such as, but not limited to, an exhaust fan having one or more blades extending radially outward from a central hub. In at least one embodiment, the exhaust evacuation system 50 may be formed from one or more exhaust fans 52 in fluid communication with the exhaust system 28 to evacuate air from the exhaust system 28. The greater the pressure differential between the compressed air and the expanded air in the exhaust system 28, the greater the amount of energy and heat extracted from the data center component to be cooled 12 and displaced out of the data center 14. Creating a low pressure environment within the exhaust system 28 using the exhaust evacuation system 50 reduces the risk of exhaust pressure build up when multiple data center cooling systems 10 are operating simultaneously to cool multiple data center components 12. In at least one embodiment, the exhaust evacuation system 50 may be used to reduce pressure within the exhaust system 28 to less than ambient pressure, thereby creating a vacuum, to assist in removing exhaust air from the data center cooling system 10.

The data center cooling system 10 may also include one or more pressure sensors 54, as shown in FIG. 1, for determining pressure within the turbo-expander housing 20 downstream of the rotary turbine 18. The control system 40 may be configured such that the exhaust evacuation system 50 is only operated when a potential for back pressure is determined. Such a condition is dependent upon the number of turbo-expanders 16, the number of data center components being cooled 12, the design of the exhaust system 28, et cetera. Thus, the control system 40 may be programmed based upon the configuration of the data center cooling system 10.

The thermal transfer system 22 may have any appropriate configuration. The thermal transfer system 22 may be configured to cool a component to be cooled 12 via a number of ways. For example, and not by way of limitation, the thermal transfer system 22 may be configured to cool a component to be cooled 12 be the thermal transfer system 22 being placed into a stream of air flowing into the cooling system of the component to be cooled 12, being placed into contact with the component to be cooled 12, and the like. Each of these configurations is discussed in more detail below. In the embodiment in which the thermal transfer system 22 is configured to be placed in contact with the data center component to be cooled 12, the thermal transfer system 22 may include an inlet connection 76 configured to be in contact with a data center component to be cooled 12. The inlet connection 76 may have any appropriate configuration enabling the thermal transfer system 22 to be placed into contact with data center component to be cooled 12, thereby enabling heat to be transferred via conduction.

In at least one embodiment, the thermal transfer system 22 may include a plurality of heat transfer fins 56. The heat transfer fins 56 may extend radially inward from the turbo-expander housing 20 into an expanded fluid pathway 58 such that the heat transfer fins 56 are placed into contact with expanded fluid passed downstream from the expansion chamber 30. In at least one embodiment, the thermal transfer system 22 may include at least eight heat transfer fins 56. In other embodiments, the thermal transfer system 22 may include one or more heat transfer fins 56.

The data center cooling system 10 may also be configured such that the brake system 24 further includes one or more heat transfer screens 60 positioned within an internal fluid flowpath 62. The brake system 24 may be formed from any appropriate configuration and system, such as, but not limited to, a physical system, an electromechanical system and an electronic system.

The data center cooling system 10 may also be configured to include one or more compressors 46 for compressing air to supply compressed air to the rotary turbine 18 of the turbo-expander 16. The data center cooling system 10 may also include at least one conduit 64 extending from the compressor 46 to the inlet 32. The conduit 64 may be formed from materials, such as, but not limited to, a reinforced rubber conduit, such as a conventional high pressure hydraulic hose. The conduit 64 extending from the compressor 46 to the inlet 32 may be formed from conductive material such that compressed air traveling through the conduit 64 achieves ambient temperature quickly when traveling in the data center 14. The compressor 46 may be positioned outside of the data center 14 so that heat generated from compressing a fluid, such as, but not limited to, air, does not release heat to the environment contained within the data center 14. Thus, the heat generated by the compressor 46 does not increase heat within the data center 14 nor increase the temperature within the data center 14.

The data center cooling system 10 may also include an air dryer 66 positioned upstream of the rotary turbine 18 to condition the air. The data center cooling system 10 may also include an air filter 68 positioned upstream of the rotary turbine 18 to filter particulates and other materials from the air.

The data center cooling system 10 may also include a resonance control system 70 configured to limit resonance frequencies within the data center cooling system 10. The resonance control system 70 may be configured such that the turbo-expander housing 20 houses the rotary turbine 18, brake system 24 and the thermal transfer system 22. The resonance system 70 may be configured within the data center cooling system 10 such that internal chambers of the data center cooling system 10 should not be single frequency resonance cavities. Otherwise, the internal chambers will have a tendency to resonate at that single frequency with an audible tone and vibrations that could cause mechanical damage. The resonance control system 70 may include the turbo-expander housing 20 having a radially tapered inner surface 72 moving downstream from the rotary turbine 18 to the brake system 24.

The data center cooling system 10 may be used to cool components 12 of a data center 14. The data center 14 may be configured to house one or a plurality of electrical components, such as, but not limited to, computers, routers, servers, graphical user interfaces (GUIs), monitors, power supplies, backup power supplies, and the like. The data center 14 may be a room containing at least one electrical component to be cooled 12. The data center 14 may have a single room or a plurality of rooms. The data center 14 may be a standalone building or may be contained within a building that also houses other rooms configured for purposes other than a data center. The data center 14 may include one or more heating, ventilating and air conditioning systems (HVAC) configured to control the temperature within the data center 14. The HVAC system may be sized to account for the heat generated by components 12 housed within the data center 14.

During use of the data center cooling system 10, the control system 40 monitors the temperatures of various components within the data center 14, such as, but not limited to, use of one or more sensors. When a component reaches greater than a threshold temperature, the control system 40 activates cooling of that component via the data center cooling system 10. In particular, the control system 40 activates the compressor 46 to compress a fluid, such as, but not limited to air. The compressor 46 provides compressed fluid to the expansion chamber 30 via an inlet 32. The incoming compressed air impinges on the vanes 34 for efficiently converting airflow to a rotational energy such as by using laminar flow. The airflow causes the rotary turbine 18 to spin, which in turn causes the shaft 26 to spin as well. The shaft 26 is connected to the brake system 24, which is offset from the rotary turbine 18 and the expansion chamber 30. The incoming compressed air performs work on the spinning rotary turbine 18, which has resistance from the brake system 24. The expanding air causing the rotary turbine 18 to spin is cooled by an amount approximately equal to the energy imparted on the shaft 26 supporting the rotary turbine 18 and coupled to the brake system 24. The cooled air flows through the thermal transfer system 22 separating the rotary turbine 18 from the brake system 24, where the cooled air draws heat from the component of the data center cooling system to be cooled 12 and coupled to the thermal transfer system 22. As such, the turbo-expander 16 cools the component 12 of the data center cooling system 10. The cooled air flowing through the thermal transfer system 22 picks up heat, thereby causing the cooled air to warm as it moves through the turbo-expander 16. The cooled air then flows into the brake system 24. The brake system 24 is higher in temperature due to the braking resistance imparted by the brake system 24 than the expansion chamber 30.

In at least one embodiment, the brake system 24 may be hot, such as with a temperature between about 100 degrees Fahrenheit and about 500 degrees Fahrenheit depending on the configuration. The brake system 24 partially brakes the shaft 26 spinning at high speeds. The brake system 24 may be thermally isolated from the rotary turbine 18 positioned in the expansion chamber 30 to prevent heating the component 12 of the data center cooling system 10 for which the data center cooling system 10 is configured to cool. The flowing air moves heat generated by the braking system 24 out of the turbo-expander housing 20 via the exhaust system 28, and in at least one embodiment, may exhaust air from through an exhaust port 78 into an exhaust system 28, which may include an unpressurized exhaust conduit 80. In at least one embodiment, the unpressurized exhaust conduit 80 may be insulated or formed from insulating materials that prevents or substantially prevents heat from the exhaust port 78 from being transferred back into the data center 14. The more air that flows through the data center cooling system 10, the easier it is to exhaust hot air out of the exhaust system 28 and the data center 14. The data center component 10 to be cooled may experience a reduction in temperature of between about two degrees Fahrenheit and about fifteen degrees Fahrenheit.

Once the data center cooling system 10 has been cooled, the data center component to be cooled 12 may be cooled through a number of different means. For example, the data center component 12 to be cooled may be cooled by placing the data center cooling system 10 within an airstream 82 forming the intake cooling air supplied to the data center component to be cooled 12, as shown at 92 in FIG. 1. In particular, the thermal transfer system 22 of the data center cooling system 10 may be positioned within the intake cooling air 82 supplied to the data center component to be cooled 12. In at least one embodiment, this includes positioning all of, or at least a portion of, the data center cooling system 10 within the intake cooling air 82 supplied to the data center component to be cooled 12. Doing so enables the thermal transfer system 22 of the data center cooling system 10 to pull heat out of the intake air to cool the intake air before entering the data center component to be cooled 12. In such an embodiment, the thermal transfer system 22 may include one or more heat fins 84 exposed to the ambient environment 86 to contact the intake cooling air 82, thereby enabling the thermal transfer system 22 to cool the intake cooling air 82.

In yet another embodiment, the thermal transfer system 22 may directly contact the data center component to be cooled 12, as shown at 96 in FIG. 1. For instance, the thermal transfer system 22 may directly contact the data center component to be cooled 12 via one or more contact points, thereby enabling the thermal transfer system 22 to act as a heat sink for the data center component to be cooled 12. In such an embodiment, the data center component to be cooled 12 may be configured not to include a cooling fan. Rather, the thermal transfer system 22 of the data center cooling system 10 would provide the necessary cooling to the data center component to be cooled 12. In such an embodiment, the entire ambient temperature of the data center 14 via a HVAC system may be increased by about five to fifteen degrees warmer than conventional systems, which results in tremendous energy costs savings.

In another embodiment, the data center cooling system 10 may be contained within the data center component to be cooled 12, as shown at 94 in FIG. 1. For example, and not by means of limitation, the data center cooling system 10 may be contained within the data center component to be cooled 12 and may have an inlet 32 in fluid communication with the expansion chamber 30, whereby the inlet 32 includes an inlet connection 76 exposed outside of the data center component to be cooled 12 such that a compressed air supply conduit 88 may be connected to an inlet connection 76 on the data center component to be cooled 12. The inlet connection 76 may be any appropriate connection, such as a permanent or releasable connector. The expanded exhaust air may be exhausted from the turbo-expander housing 20 via the exhaust system 28. The exhaust system 28 may include at least one exhaust outlet 78 positioned outside of the data center component to be cooled 12. The exhaust system 28 may include an exhaust port 78 in the data center component to be cooled 12, and the exhaust port 78 may be coupled to an unpressurized exhaust conduit 80 to direct the exhaust gases from the data center component to be cooled 12. In such an embodiment, the data center cooling system 10 may be contained within the data center component to be cooled 12 and the compressed air supply is connected to an inlet connection 76 on the data center component to be cooled 12 and an exhaust conduit 80 is connected to an exhaust connection 78 on the data center component to be cooled 12. The compressed air is supplied to the data center cooling system 10 contained within the data center component to be cooled 12 to cool the data center component to be cooled 12, and then the hot air is exhausted from the data center component to be cooled 12 via the exhaust system 28 of the data center cooling system 10 outside of the data center component to be cooled 12. This embodiment avoids the need to move heat away from the hottest parts of the equipment such as the central processing unit (CPU) to remote heat sinks. Instead, data center cooling system 10 may be placed in the immediate proximity of the heat generating components of the data center component to be cooled 12, and more specifically, the thermal transfer system 22 of the data center cooling system 10 may be placed in the immediate proximity of the heat generating components of the data center component to be cooled 12.

In other embodiments, the resonance control system 70 may have other configurations for limiting undesirable resonance frequencies during operation of the data center cooling system 10. The resonance control system 10 may also control the resonance within the data center cooling system 10 by having the control system 70 modulate the adjustable inlet valve 38. Modulating the adjustable inlet valve 38 prevents air pressure within the data center cooling system 10 from being constant for more than a very brief period of time thereby prevents the data center cooling system 10 from storing energy.

The foregoing is provided for purposes of illustrating, explaining, and describing embodiments of this invention. Modifications and adaptations to these embodiments will be apparent to those skilled in the art and may be made without departing from the scope or spirit of this invention. Upon reviewing the aforementioned embodiments, it would be evident to an artisan with ordinary skill in the art that said embodiments can be modified, reduced, or enhanced without departing from the scope and spirit of the claims described below.

We claim:

1. A data center cooling system, comprising:
at least one turbo-expander comprising
a turbo-expander housing;
a rotary turbine coupled to a shaft and positioned within an expansion chamber in the turbo-expander housing;
an inlet in fluid communication with the expansion chamber;
a brake system coupled to the shaft and offset from the rotary turbine and the expansion chamber; and
wherein the rotary turbine and the brake system are separated from each other via at least one thermal transfer system.

2. The data center cooling system of claim 1, further comprising at least one adjustable inlet valve in fluid communication with the inlet.

3. The data center cooling system of claim 2, further comprising a control system having an adjustable inlet valve control module configured to control the at least one adjustable inlet valve based upon operating temperatures of a data center component in communication with the data center cooling system.

4. The data center cooling system of claim 1, further comprising at least one exhaust system extending from the turbo-expander housing and configured to exhaust outside of a data center.

5. The data center cooling system of claim 4, further comprising at least one exhaust evacuation system configured to reduce pressure within the exhaust system.

6. The data center cooling system of claim 5, further comprising an exhaust fan in communication with the turbo-expander housing to reduce pressure within the turbo-expander housing downstream of the rotary turbine.

7. The data center cooling system of claim 6, further comprising at least one pressure sensor for determining pressure within the turbo-expander housing downstream of the rotary turbine.

8. The data center cooling system of claim 1, wherein the at least one thermal transfer system separating the rotary turbine from the brake system includes a plurality of heat transfer fins.

9. The data center cooling system of claim 1, wherein the brake system further comprises at least one heat transfer screen positioned within an internal fluid flowpath.

10. The data center cooling system of claim 1, further comprising at least one compressor for compressing air to supply compressed air to the rotary turbine of the at least one turbo-expander.

11. The data center cooling system of claim 1, further comprising a resonance control system configured to limit resonance frequencies within the data center cooling system.

12. The data center cooling system of claim 11, wherein the resonance control system comprises the turbo-expander housing having a radially tapered inner surface moving downstream from the rotary turbine to the brake system.

13. The data center cooling system of claim 1, wherein the at least one thermal transfer system includes a device connection configured to be in contact with a data center component to be cooled.

14. A data center cooling system, comprising:
at least one turbo-expander comprising a turbo-expander housing;
a rotary turbine coupled to a shaft and positioned within an expansion chamber in the turbo-expander housing;
an inlet in fluid communication with the expansion chamber; at least one adjustable inlet valve in fluid communication with the inlet; a control system having an adjustable inlet valve control module configured to control the at least one adjustable inlet valve based upon operating temperatures of a data center component in communication with the data center cooling system;
a brake system coupled to the shaft and offset from the rotary turbine and the expansion chamber;
wherein the rotary turbine and the brake system are separated from each other via at least one thermal transfer system; and
at least one exhaust system extending from the turbo-expander housing and configured to exhaust outside of a data center.

15. The data center cooling system of claim 14, further comprising at least one exhaust evacuation system configured to reduce pressure within the exhaust system.

16. The data center cooling system of claim 15, further comprising an exhaust fan in communication with the turbo-expander housing to reduce pressure within the turbo-expander housing downstream of the rotary turbine and at least one pressure sensor for determining pressure within the turbo-expander housing downstream of the rotary turbine.

17. The data center cooling system of claim 14, further comprising a resonance control system configured to limit resonance frequencies within the data center cooling system and wherein the resonance control system comprises the turbo-expander housing having a radially tapered inner surface moving downstream from the rotary turbine to the brake system.

18. The data center cooling system of claim 14, wherein the at least one thermal transfer system includes a device connection configured to be in contact with a data center component to be cooled.

19. A data center, comprising:
a room containing at least one electrical component to be cooled; a data center cooling system, comprising: at least one turbo-expander comprising a turbo-expander housing;
a rotary turbine coupled to a shaft and positioned within an expansion chamber in the turbo-expander housing;
an inlet in fluid communication with the expansion chamber; at least one exhaust system extending from the turbo-expander housing and configured to exhaust outside of the data center;
a brake system coupled to the shaft and offset from the rotary turbine and the expansion chamber;
wherein the rotary turbine and the brake system are separated from each other via at least one thermal transfer system; and
wherein the at least one thermal transfer system is configured to cool the at least one electrical component to be cooled; and
at least one compressor for compressing air to supply compressed air to the rotary turbine of the at least one turbo-expander.

20. The data center of claim 19, further comprising at least one adjustable inlet valve in fluid communication with the inlet and a control system having an adjustable inlet valve control module configured to control the at least one adjustable inlet valve based upon operating temperatures of a data center component in communication with the data center cooling system.

21. The data center of claim 19, wherein the at least one thermal transfer system includes a device connection configured to be in contact with a data center component to be cooled.

* * * * *